United States Patent
Chu et al.

(10) Patent No.: US 10,043,705 B2
(45) Date of Patent: Aug. 7, 2018

(54) MEMORY DEVICE AND METHOD OF FORMING THEREOF

(71) Applicant: TAIWAN SEMICONDUCTOR MANUFACTURING CO., LTD., Hsinchu (TW)

(72) Inventors: Yen-Chang Chu, Tainan (TW); Yao-Wen Chang, Taipei (TW); Sheng-Chau Chen, Tainan (TW); Alexander Kalnitsky, San Francisco, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/423,771

(22) Filed: Feb. 3, 2017

(65) Prior Publication Data
US 2018/0158728 A1    Jun. 7, 2018

Related U.S. Application Data

(60) Provisional application No. 62/429,957, filed on Dec. 5, 2016.

(51) Int. Cl.
*H01L 21/768* (2006.01)
*H01L 23/532* (2006.01)
*H01L 43/02* (2006.01)
*H01L 43/08* (2006.01)
*H01L 43/10* (2006.01)
(Continued)

(52) U.S. Cl.
CPC .... *H01L 21/76832* (2013.01); *H01L 21/7684* (2013.01); *H01L 21/76802* (2013.01); *H01L 21/76846* (2013.01); *H01L 21/76877* (2013.01); *H01L 23/5226* (2013.01); *H01L 23/53266* (2013.01); *H01L 23/53295* (2013.01); *H01L 27/228* (2013.01); *H01L 27/2436* (2013.01); *H01L 43/02* (2013.01); *H01L 43/08* (2013.01); *H01L 43/10* (2013.01); *H01L 43/12* (2013.01); *H01L 45/085* (2013.01); *H01L 45/1233* (2013.01); *H01L 45/1253* (2013.01); *H01L 45/146* (2013.01); *H01L 45/1675* (2013.01)

(58) Field of Classification Search
CPC ............. H01L 45/1253; H01L 45/1233; H01L 45/1675; H01L 45/16; H01L 23/5226; H01L 23/5329; H01L 21/76832; H01L 43/10; H01L 43/12; H01L 23/53266; H01L 23/53295; H01L 45/146; H01L 21/76877; H01L 43/08; H01L 21/7684; H01L 43/02; H01L 27/228; H01L 27/2436; H01L 21/76846; H01L 45/085; H01L 21/76802
USPC .......................................................... 257/4
See application file for complete search history.

(56) References Cited

U.S. PATENT DOCUMENTS

2014/0264233 A1* 9/2014 Tu .................. H01L 45/146
257/4
2017/0012198 A1* 1/2017 Huang ............... H01L 45/1253

* cited by examiner

*Primary Examiner* — Caleen Sullivan
(74) *Attorney, Agent, or Firm* — McClure, Qualey & Rodack, LLP

(57) ABSTRACT

A memory device includes a dielectric structure, a tungsten plug, a bottom electrode, a resistance switching element and a top electrode. The dielectric structure has an opening. The tungsten plug is embedded in the opening of the dielectric structure. The bottom electrode extends along top surfaces of the dielectric structure and the tungsten plug. The resistance switching element is present over the bottom elec-
(Continued)

trode. The top electrode is present over the resistance switching element.

20 Claims, 9 Drawing Sheets

(51) Int. Cl.
*H01L 43/12* (2006.01)
*H01L 45/00* (2006.01)
*H01L 27/22* (2006.01)
*H01L 27/24* (2006.01)
*H01L 23/522* (2006.01)

MEMORY DEVICE AND METHOD OF FORMING THEREOF

PRIORITY CLAIM AND CROSS-REFERENCE

This application claims priority to U.S. Provisional Application Ser. No. 62/429,957, filed Dec. 5, 2016, which is herein incorporated by reference.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
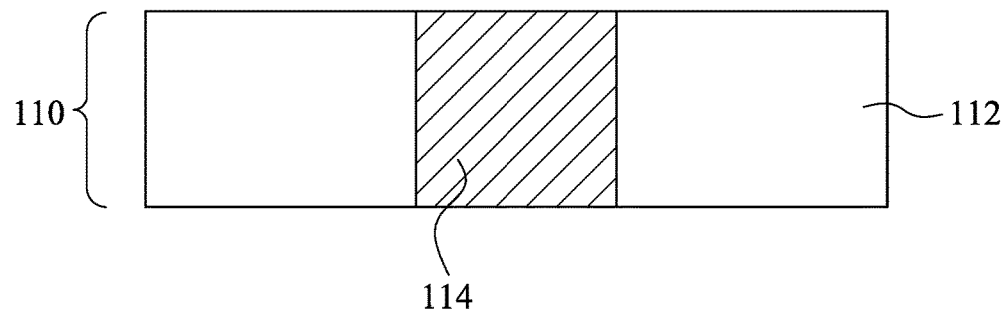
FIGS. 1 through 15 illustrate some embodiments to form a memory device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different types of devices on a single substrate to achieve higher integration. One example is a substrate having a logic region, in which logic devices are formed, and a memory region, in which magnetic random access memory (MRAM) or resistive random access memory (RRAM) devices are formed. To form these memory cells, which are formed in an interconnection structure overlying the substrate, a bottom electrode layer can be formed in the interconnection structure and over the memory region, and chemical mechanical polishing (CMP) can be used to planarize the bottom electrode layer. In such manufacturing processes, however, chemical mechanical polishing (CMP) may damage some metal interconnection lines in the logic region or other regions. This is due to the fact that some metal interconnection lines are significantly raised because of topography of the entire wafer. For example, when polishing selectivity between the bottom electrode layer and underlying polish stop layer is low, CMP may overpolish the polish stop layer, which means the polish stop layer cannot "stop" or "resist" CMP well, and hence raised metal interconnection lines in the logic region or other regions may be exposed to CMP and hence damaged by the CMP.

Accordingly, the present disclosure relates to integrated circuit (IC) techniques to protect raised metal interconnection lines from CMP. Approaches include employing tungsten as bottom electrode via (BEVA) embedded in polish stop structure. Polish selectivity between tungsten and the polish stop structure, such as silicon-rich oxide or silicon carbide, is great enough such that the polish stop structure tends to "resist" or "stop" the CMP well, and hence damage to the raised metal interconnection lines caused by the CMP can be mitigated. Further, tungsten intrinsically has a good gap filling ability to fill via opening in the polish stop structure, and therefore, employing tungsten as BEVA may be advantageous to prevent voids or dimples in the BEVA as well. Since substantially void-free or dimple-free BEVA may provide a substantially flat top surface, it is advantageous to form flat layers of bottom electrode, magnetic tunnel junction, RRAM dielectric, and/or top electrode thereon.

FIGS. 1 through 15 illustrate some embodiments to form a memory device. FIG. 1 shows a cross-section view of a structure during manufacture of a memory device. FIG. 1 illustrates a wafer having a substrate 110 thereon. The substrate 110 includes an inter-layer dielectric (ILD) layer or inter-metal dielectric (IMD) 112 with a metallization pattern 114. The ILD layer 112 may be an extra low-k dielectric (ELK) layer, such as carbon doped silicon dioxide, may be an oxide, such as silicon oxide, and/or may be the like or a combination thereof. The metallization pattern 114 may be copper, aluminum, the like, and/or a combination thereof. The substrate 110 may also include active and passive devices, for example, underlying the ILD layer 112. These further components are omitted from the figures for clarity, and how these components are formed will be readily apparent to a person having ordinary skill in the art.

Figure 2:
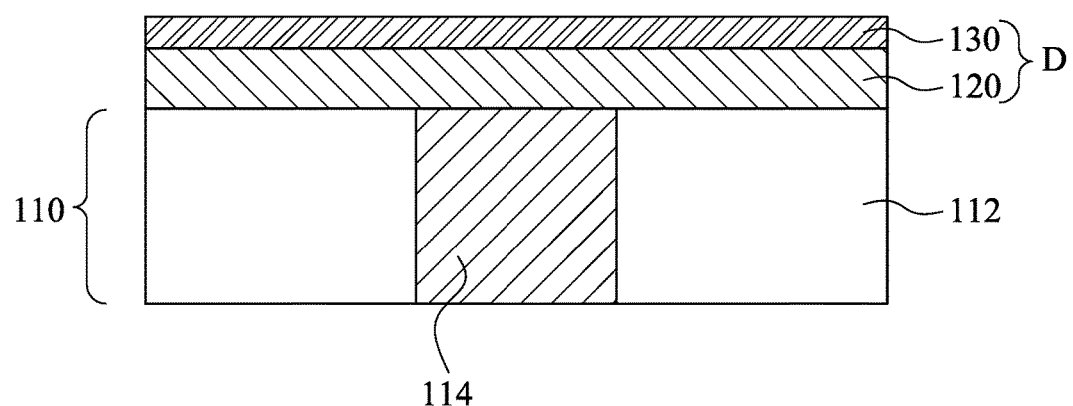

FIG. 2 illustrates formation of a dielectric structure over the substrate 110. In the depicted embodiments, a first dielectric layer 120 is blanket formed over the substrate 110, and a second dielectric layer 130 is then formed over the first dielectric layer 120. The first and second dielectric layers 120 and 130 can be in combination referred to as a dielectric structure D in some embodiments. In other embodiments, single dielectric layer is used, or further dielectric layers are used. The dielectric structure D can act as a polish stop structure in one or more polishing processes performed to bottom electrode materials (e.g. tungsten) subsequently. The first dielectric layer 120 in this example is silicon carbide (SiC) layer, which may act as a suitable polish stop layer in the one or more polishing processes performed to subsequently formed bottom electrode materials. In some alternatively embodiments, the first dielectric layer 120 may include silicon oxynitride (SiON), the like, and/or a combination thereof. The second dielectric layer 130 is silicon-rich oxide layer in this example, which may act as a suitable polish stop layer in the one or more polishing processes performed to subsequently formed bottom electrode materials. In other embodiments, the second dielectric layer 130 may include silicon nitride (SiN), the like, and/or a combination thereof. Further, the first dielectric layer 120 and the second dielectric layer 130 may be the same or different materials and/or compositions. Each of the first dielectric layer 120 and the second dielectric layer 130 may be formed by acceptable deposition techniques, such as chemical vapor deposition (CVD), atomic layer deposition (ALD), physical vapor deposition (PVD), the like, and/or a combination thereof.

Figure 3:
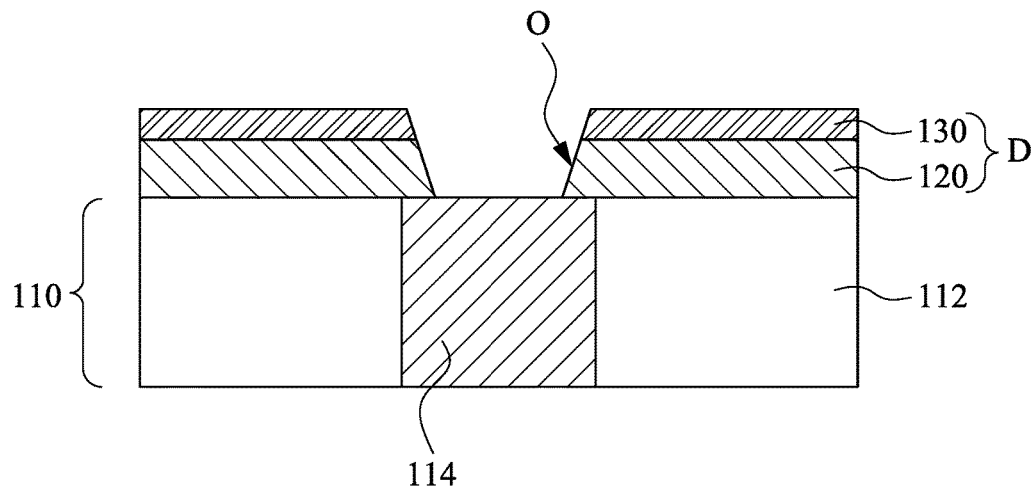

FIG. 3 illustrates formation of an opening O in the dielectric structure D. The opening O is formed through the first dielectric layer 120 and the second dielectric layer 130 to expose at least a portion of the metallization pattern 114. The opening O may be formed using acceptable lithography techniques, such as by an anisotropic etch. For example, mask layer (not shown) is formed over the second dielectric layer 130 to form the opening O. In some embodiments, the mask layer can be a nitrogen free anti-reflection layer overlying the second dielectric layer. In some other embodiments, the mask layer can be a photoresist layer having opening corresponding to the opening O to be formed. An etchant is used to remove an exposed portion of the second dielectric layer 130 and underlying portion of the first dielectric layer 120. In some embodiments, the opening O can be formed through a dry etch process such as a plasma etching. By adjusting powers and flow rate of reactant gases used in the plasma etching, contour of the opening O can be controlled. In some embodiments, a tapered or curved sidewall can be formed in the opening O to facilitate subsequent reliable filling of the opening O with conductive materials.

Figure 4:
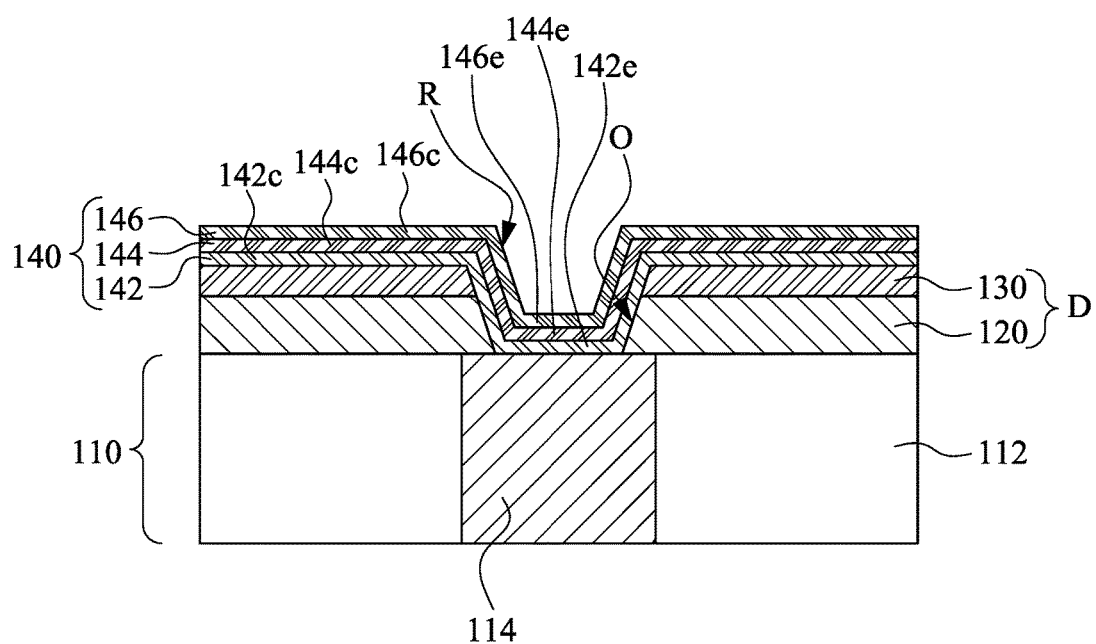

FIG. 4 illustrates formation of a lining metal layer 140 conformally over the dielectric structure D. The lining metal layer 140 lines sidewall of the opening O and top surface of the metallization pattern 114, and hence the lining metal layer 140 can also be referred to as a liner or a metal liner in the opening O. Since the lining metal layer 140 is conformally formed over the opening O, the lining metal layer 140 can defines a recess R over the opening O, and this recess R can be later filled by tungsten to form a bottom electrode via (BEVA).

In some embodiments, the lining metal layer 140 may include a diffusion barrier layer 142. The diffusion barrier layer 142 may be blanket deposited on the dielectric structure D and along sidewall and bottom of the opening O. The diffusion barrier layer 142 can prevent diffusion between the metallization pattern 114 and bottom electrode materials, such as tungsten, subsequently filled in the opening O in the dielectric structure D. For example, the diffusion barrier layer 142 has an embedded portion 142e embedded in the opening O and a capping portion 142c capping top surface of the second dielectric layer 130. The embedded portion 142e is a conformal layer extending along sidewall of the opening O and top surface of the metallization pattern 114 and defines a recess. In other words, the sidewall of the opening O and the top surface of the metallization pattern 114 is covered by the embedded portion 142e of the diffusion barrier layer 142, and hence the embedded portion 142e can prevent diffusion between the metallization pattern 114 and tungsten subsequently filled in the opening O.

The diffusion barrier layer 142 is tantalum-containing layer in this example, such as a tantalum nitride (TaN) layer, which can act as a suitable barrier to prevent metal diffusion between the metallization pattern 114 and tungsten. Moreover, polish selectivity between tungsten and tantalum nitride is great enough such that tantalum nitride tends to "resist" the CMP subsequently performed to polish tungsten. Therefore, in some embodiments where the diffusion barrier layer 142 is tantalum nitride layer, the tantalum nitride layer may help slow down or even stop the CMP performed to tungsten, and hence damage to raised metal interconnection lines (not shown in this figure) can be further mitigated. Formation of the diffusion barrier layer 142 may be exemplarily performed using CVD, PVD, ALD, the like, and/or a combination thereof. For instance, tantalum nitride layer may be conformally formed over the second dielectric layer 130 using ALD to serve as the diffusion barrier layer 142. The diffusion barrier layer 142 has a thickness in a range from about 30 Angstrom to about 50 Angstrom, as example.

In some embodiments, the lining metal layer 140 may include a glue layer over the diffusion barrier layer 142, and the glue layer has higher adhesion ability to tungsten than that of the diffusion barrier layer 142. Therefore, the glue layer over the diffusion barrier layer 142 can be advantageous to enhance adhesion of tungsten to the dielectric structure D. In some embodiments, the glue layer may be titanium-containing layer, which may be a single-layered structure or a multi-layered structure. For example, the glue layer in this example may include a titanium layer 144 over the diffusion barrier layer 142 and a titanium nitride layer 146 over the titanium layer 144. The titanium layer 144 includes an embedded portion 144e embedded in the recess defined by the embedded portion 142e of the diffusion barrier layer 142 and a capping portion 144c atop capping portion 142c of the diffusion barrier layer 142. The titanium embedded portion 144e is a conformal layer extending along sidewall and bottom surface of the recess defined by the tantalum nitride embedded portion 142e. The titanium nitride layer 146 includes an embedded portion 146e embedded in the recess defined by the titanium embedded portion 144e and a capping portion 146c atop titanium capping portion 144c. The titanium nitride embedded portion 146e is a conformal layer extending along sidewall and bottom surface of the recess defined by the titanium embedded portion 144e.

Combination of the titanium layer 144 and titanium nitride layer 146 may act as a suitable glue layer to adhere tungsten subsequently filled in the recess R. Formation of the titanium layer 144 and titanium nitride layer 146 may be exemplarily performed using CVD, PVD, ALD, the like, and/or a combination thereof. For instance, the titanium layer 144 may be conformally formed over the diffusion barrier layer 142 using PVD, and the titanium nitride layer 146 may be conformally formed over the titanium layer 144 using metal organic chemical vapor deposition (MOCVD). The titanium layer 144 has a thickness in a range from about 90 Angstrom to about 110 Angstrom, and the titanium nitride layer 146 has a thickness in a range from about 190 Angstrom to about 210 Angstrom, as example.

Figure 5:
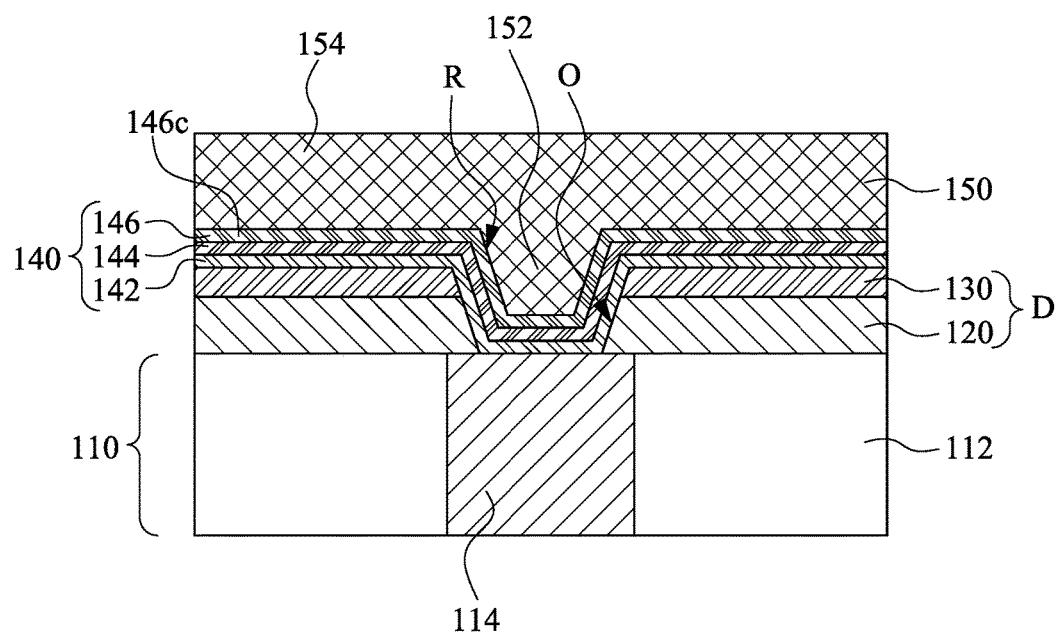

FIG. 5 illustrates formation of a tungsten layer 150 over the lining metal layer 140. The tungsten layer 150 may overfill the opening O of the dielectric structure D. For example, the tungsten layer 150 may include an embedded portion 152 and an excess portion 154. The embedded portion 152 is embedded in the recess R defined by the lining metal layer 140. The excess portion 154 overlies the embedded portion 152 and the capping portion 146c of the titanium nitride layer 146. Since tungsten intrinsically has a good gap filling ability, the embedded portion 152 can fill the recess R well, and hence the tungsten layer 150 can be substantially free from voids in the embedded portion 152 and/or dimples in top surface of the excess portion 154 over the recess R. Formation of the tungsten layer 150 may be exemplarily performed using CVD, PVD, ALD, the like, and/or a combination thereof. In the instant example, the tungsten layer 150 is formed over the substrate 110 using CVD.

Figure 6:
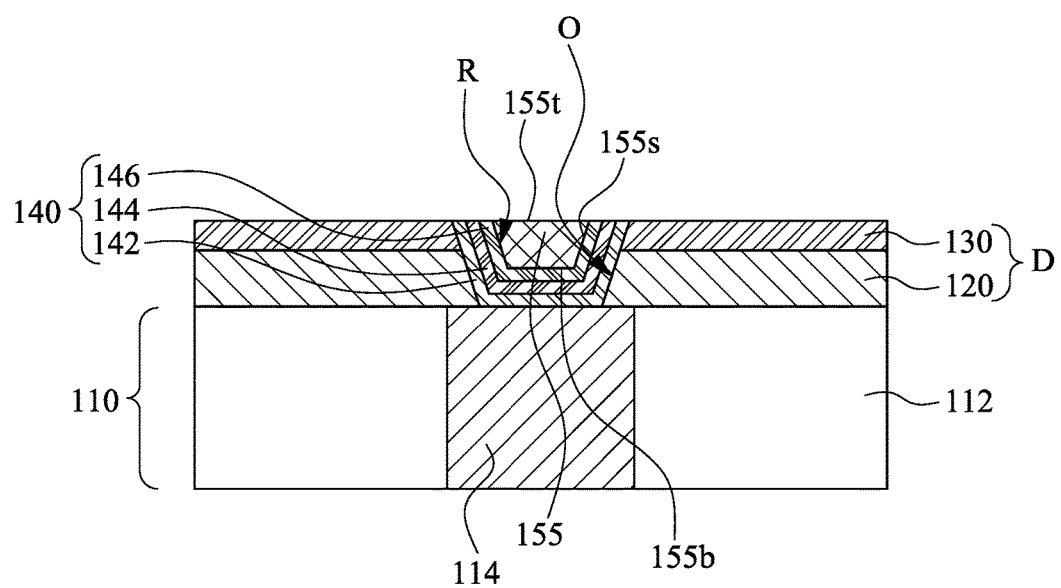

FIG. 6 illustrates a CMP process performed to the tungsten layer 150 to leave a tungsten plug 155 in the opening O of the dielectric structure D. The CMP process may remove the excess portion 154 (see FIG. 5) of the tungsten layer 150 outside the recess R defined by the lining metal layer 140, while leaving the embedded portion 152 (see FIG. 5) in the recess R to serve as the tungsten plug 155. The recess R is filled by the tungsten plug 155, and hence the tungsten plug 155 can be referred to as a tungsten filler in some embodiments. Since the tungsten layer 150 is substantially free from voids and/or dimples over the recess R, the remaining tungsten plug 155 in the recess R can be substantially free from voids and/or dimples as well. Such substantially void-free and/or dimple-free tungsten plug 155 has a substantially flat top surface and is therefore advantageous to from flat layers thereon in subsequent processes.

CMP is a process that utilizes the reagent within slurry to react chemically with the front face of the wafer, and produce an easily polished layer. Herein, the front face of the wafer reacting with the slurry is top surface of the excess tungsten portion 154. Such slurry may contain some active polishing ingredients such as abrasive particles. Together with the abrasive action provided by the abrasive particles in the slurry under a polishing pad, the excess tungsten portion 154 is gradually removed. After the CMP process, de-ionized water may be optionally used to clear away residue from the CMP process, such as the slurry and abrasive particles on the wafer.

If the recess R was filled by titanium nitride, the dielectric structure D may not stop the CMP well. This is due to the fact that the polish selectivity between titanium nitride and dielectric materials is low. Stated differently, difference between polish rates of titanium nitride and dielectric materials is low. Such insufficient polish selectivity or polish rates difference may cause that the CMP cannot be stopped well, and hence raised metal interconnection lines in other region (e.g. logic region) of the substrate 110 may be damaged by the CMP.

Accordingly, high-selectivity slurry (HSS), which has high selectivity between tungsten and dielectric materials, may be used in the polishing process so that the determination of the polishing end point is made clearer. That is, the dielectric structure D has a property relating to the polishing different from that of the tungsten layer 150, such that the dielectric structure D may act as a CMP stop structure in the polishing process. In some embodiments, the slurry having high selectivity between the tungsten layer 150 and the dielectric structure D includes aluminum oxide, potassium hydroxide, malonic acid, ferric nitrate, de-ionized water, or any combination thereof, for example. In some embodiments, the dielectric structure D may have a higher resistance to the polishing than that of the tungsten layer 150. That is to say, in some embodiments, the dielectric structure D may have a greater hardness or a higher resistance to acidic solutions in the slurry than that of the tungsten layer 150. Therefore, the polish rate of the dielectric structure D is very slow compared to the polish rate of the tungsten layer 150. In this way, the CMP process is performed until the top surface of the dielectric structure D is exposed. Stated differently, the dielectric structure D can stop the CMP well, and hence damage to the raised metal interconnection lines in other region (e.g. logic region) of the substrate 110 caused by the CMP can be mitigated.

For instance, in some embodiments where the second dielectric layer 130 of the dielectric structure D includes silicon-rich oxide, ratio of the polish rate of tungsten to the polish rate of silicon-rich oxide may be about 35:1, and the second dielectric layer 130 can thus stop the CMP well. In some embodiments where the first dielectric layer 120 underlying the second dielectric layer 130 includes silicon carbide, ratio of the polish rate of tungsten to the polish rate of silicon carbide may be about 60:1. Such a ratio is further greater than the ratio of the polish rate of tungsten to the polish rate of silicon-rich oxide. Stated differently, the first dielectric layer 120 has higher polishing resistance to the slurry used to polish the tungsten layer 150 than that of the second dielectric layer 130. As such, if the second dielectric layer 130 did not stop the CMP, the CMP can be stopped by the underlying first dielectric layer 120, and hence damage to the raised metal interconnection lines in other region of the substrate 110 can be mitigated.

Moreover, in some embodiments where the diffusion barrier layer 142 includes tantalum nitride, ratio of the polish rate of tungsten to the polish rate of tantalum nitride may be about 20:1, and hence the CMP can be slowed down by the diffusion barrier layer 142 before the CMP reach the dielectric structure D. The slowing-down behavior may be advantageous to make the CMP stopped well by the dielectric structure D. In embodiments where the diffusion barrier layer 142, the second and first dielectric layers 130 and 120 respectively made of tantalum nitride, silicon-rich oxide, and silicon carbide, the interposing second dielectric layer 130 has higher polishing resistance to the CMP than that of the overlying diffusion barrier layer 142, and the underlying first dielectric layer 120 has higher polishing resistance to the CMP than that of the interposing second dielectric layer 130. In this way, the CMP will encounter increasingly polishing resistance as the CMP continues, and such increasingly polishing resistance may thus be helpful in stopping the CMP.

The CMP process also removes capping portions of the diffusion barrier layer 142, titanium layer 144, and titanium nitride layer 146 over the second dielectric layer 130 in some embodiments. After the CMP process, top surface 155t of the tungsten plug 155 may be substantially level with that of the diffusion barrier layer 142, titanium layer 144, titanium nitride layer 146 and the second dielectric layer 130. The tungsten plug 155 and embedded portions of the diffusion barrier layer 142, titanium layer 144, and titanium nitride layer 146 are remained in the opening O and can be in combination referred to as a bottom electrode via (BEVA) embedded in the dielectric structure D. A majority of the BEVA is tungsten, and hence the BEVA can be substantially free from voids and/or dimples due to the intrinsic good gap filling ability of tungsten. As such, other layers of memory device can be formed over the BEVA as flat as possible. In the BEVA, the lining metal layer 140 is shaped as a cup, and the tungsten plug 155 is embedded in the recess R in the cup-shaped lining metal layer 140. Sidewall 155s of the tungsten plug 155 abuts sidewall of the recess R. For example, sidewall 155s of the tungsten plug 155 is in contact with inner sidewall of the cup-shaped titanium nitride layer 146, and hence the cup-shaped titanium nitride layer 146 can improve the adhesion to the tungsten plug 155. Further, bottom surface 155b of the tungsten plug 155 lands on bottom of the recess R. For example, bottom surface 155b of the tungsten plug 155 is in contact with bottom surface of the cup-shaped titanium nitride layer 146, and hence the cup-shaped titanium nitride layer 146 can improve the adhesion to the tungsten plug 155.

Figure 7:
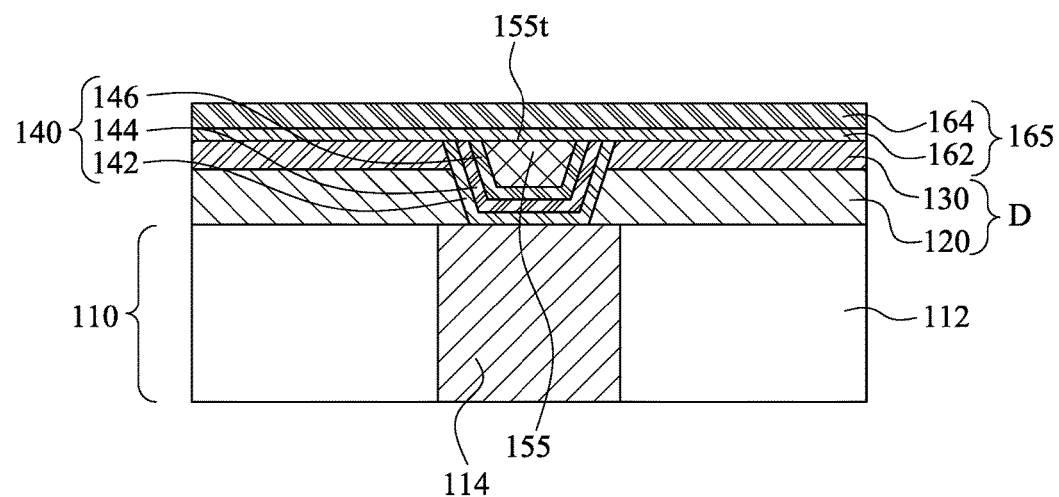

FIG. 7 illustrates formation of a blanket bottom electrode (BE) layer 165 over the dielectric structure D and the BEVA including the lining metal layer 140 and the tungsten plug 155. In other words, the bottom electrode layer 165 extends along top surfaces of the dielectric structure and the BEVA. Since the substantially void-free and/or dimple-free tungsten plug 155 has a substantially flat top surface 155t, the bottom electrode layer 165 may be formed as a substantially flat layer. In some embodiments, the bottom electrode layer 165 comprises a first conductive layer 162 over the BEVA and a second conductive layer 164 over the first conductive layer 162. The first and second conductive layers 162 and 164 have different polishing resistance properties. That is, the first conductive layer 162 has a property relating to a polishing process different from that of the second conductive layer 164, such that the first conductive layer 162 may act as a CMP stop layer in the polishing process. In other words, the first conductive layer 162 may have a higher resistance to a polishing process subsequently performed to second conductive layer 164 than that of the second conductive layer 164.

In some embodiments, the first conductive layer 162 may include tantalum nitride. Formation of the first conductive layer 162 may be exemplarily performed using CVD, PVD, ALD, the like, and/or a combination thereof. For instance, tantalum nitride layer may be conformally formed over the second dielectric layer 130 and the BEVA using PVD. The first conductive layer 162 has a thickness in a range from about 90 Angstrom to about 110 Angstrom, as example. In some embodiments, the second conductive layer 164 may include titanium nitride having different polishing resistance property from that of tantalum nitride. Moreover, titanium nitride intrinsically has higher oxidation resistance than that of the tantalum nitride, and hence forming the second conductive layer 164 over the first conductive layer 162 may be advantageous to resist oxidation of the bottom electrode layer 165. Formation of the second conductive layer 164 may be exemplarily performed using CVD, PVD, ALD, the like, and/or a combination thereof. For instance, titanium nitride layer may be conformally formed over the first conductive layer 162 (e.g. tantalum nitride layer) using PVD. The second conductive layer 164 has a thickness in a range from about 190 Angstrom to about 310 Angstrom, as example. In some embodiments, thickness of the second conductive layer 164 is greater than that of the first conductive layer 162, so that top portion of the second conductive layer 164 can be removed by subsequent CMP process, while leaving bottom portion of the second conductive layer 164 on the first conductive layer 162.

Figure 8:
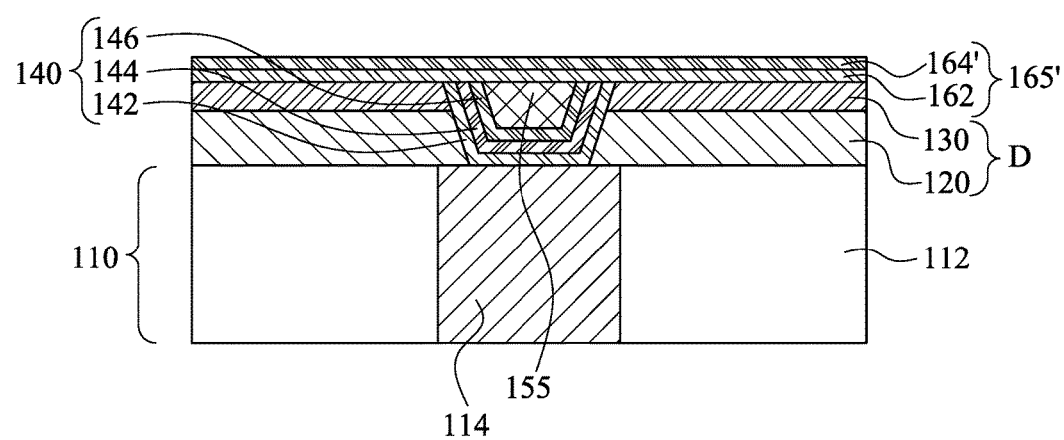

FIG. 8 illustrates a CMP process performed to the bottom electrode layer 165 to leave a polished bottom electrode layer 165' over the dielectric structure D and the BEVA including the tungsten plug 155 and the lining metal layer 140. After the CMP process, the second conductive layer 164 is thinned as the thinned conductive layer 164'. For example, the thinned conductive layer 164' may have a thickness in a range from about 90 Angstrom to about 110 Angstrom, as example. After the CMP process, de-ionized water may be optionally used to clear away residue from the CMP process, such as the slurry and abrasive particles on the wafer.

In some embodiments, duration or other parameters of the CMP can be controlled to leave the thinned conductive layer 164' over the first conductive layer 162. In some embodiments, the first conductive layer 162 may have a higher resistance to the CMP than that of the second conductive layer 164. That is to say, in some embodiments, the first conductive layer 162 may have a greater hardness or a higher resistance to acidic solutions in the slurry than that of the second conductive layer 164. Therefore, the polish rate of the first conductive layer 162 is relative slow compared to the polish rate of the second conductive layer 164. Consequently, if the CMP was not well controlled such that the second conductive layer 164 was overpolished, the first conductive layer 162 can stop the CMP due to its high polishing resistance compared to the second conductive layer 164, and hence damage to the BEVA caused by the CMP can be prevented. As a result, "dishing" of the BEVA caused by the CMP can be reduced. In some embodiments where the first conductive layer 162 and the diffusion barrier layer 142 are made of tantalum nitride, the CMP process performed to the tungsten layer 150 (see FIG. 6) and the CMP process performed to the second conductive layer 164 can use substantially the same slurry with high selectivity to tantalum nitride. In some other embodiments, these CMP processes can use different slurries.

Figure 9:
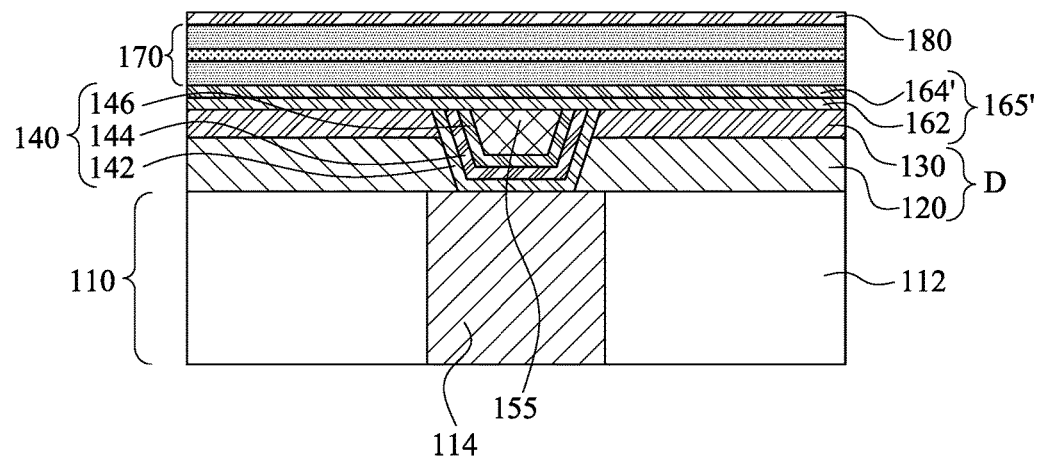

Reference is made to FIG. 9. A resistance switching layer 170 and a top electrode layer 180 are formed in succession over the bottom electrode layer 165'. The resistance switching layer 170 and the top electrode layer 180 can be formed using suitable deposition techniques, such as CVD, PVD, ALD, the like, and/or a combination thereof. Since the bottom electrode layer 165' is formed as a substantially flat layer due to the underlying void-free and/or dimple-free tungsten plug 155, the resistance switching layer 170 deposited over the bottom electrode layer 165' can be formed as a substantially flat layer, and the top electrode layer 180 deposited over the resistance switching layer 170 can be formed as a substantially flat layer as well. Such improved flatness of layers of the memory device may be advantageous to improve reliability and/or performance of the memory device.

In some embodiments, the resistance switching layer 170 may include a magnetic tunnel junction (MTJ) structure including various layers formed of different combinations of materials. In some exemplary embodiments where the resistance switching layer 170 includes MTJ structure, it may include a pinning layer, a tunnel barrier layer, and a free layer. In addition, MTJ structure may have other variations including other layers, such as anti-ferro-magnetic layers. In some embodiments, the pinning layer is formed of PtMn, tunnel barrier layer is formed of MgO, and free layer is formed of CoFeB. The magnetic moment of free layer may be programmed causing the resistance of the resulting MTJ cell to be changed between a high resistance and a low resistance.

In some embodiments, the resistance switching layer 170 may include a RRAM dielectric layer such as metal oxide composite, such as hafnium oxide ($HfO_x$), zirconium oxide (ZrO$_x$), aluminum oxide (AlO$_x$), nickel oxide (NiO$_x$), tantalum oxide (TaO$_x$), or titanium oxide (TiO$_x$) as in its relative high resistance state and a metal such as titanium (Ti), hafnium (Hf), platinum (Pt), ruthenium (Ru), and/or aluminum (Al) as in its relative low resistance state.

In some embodiments, the top electrode layer 180 may include copper, aluminum, tantalum, tungsten, tantalum nitride, titanium, titanium nitride, the like, and/or a combination thereof.

Figure 10:
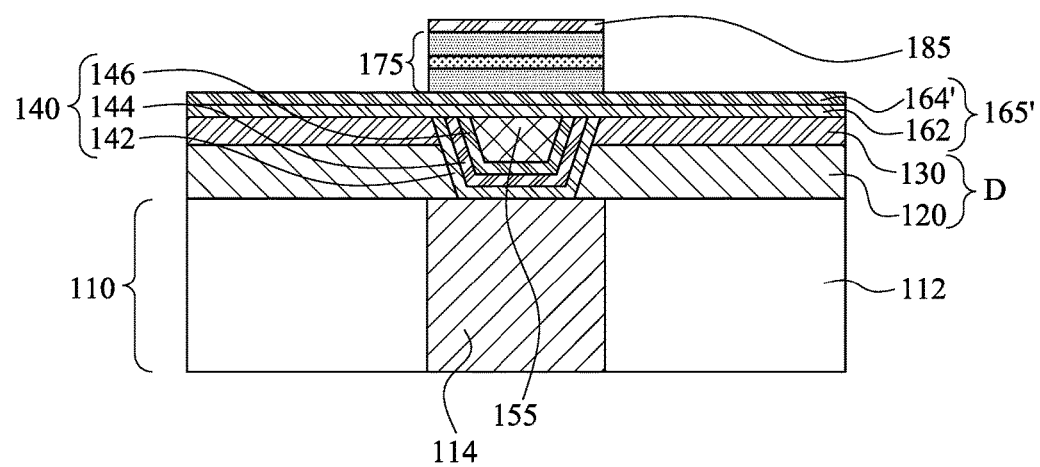

FIG. 10 illustrates patterning process of the top electrode layer 180 and the resistance switching layer 170. The patterning process may include one or more etching operations, and the top electrode layer 180 and resistance switching layer 170 are etched to form a resistance switching element 175 over the bottom electrode layer 165' and a top electrode 185 over the resistance switching element 175. The resistance switching layer 170 and top electrode layer 180 may be etched using acceptable photolithography techniques. In some embodiments, a hard mask layer and/or a photoresist layer (not shown) may be formed on the top electrode layer 180 to facilitate the patterning process. In depicted embodiments, the resistance switching element 175 and top electrode 185 are vertically overlapped with the BEVA including tungsten plug 155 and lining metal layer 140. In some other embodiments, the resistance switching element 175 and top electrode 185 are formed on other region not vertically overlapped with the BEVA.

Figure 11:
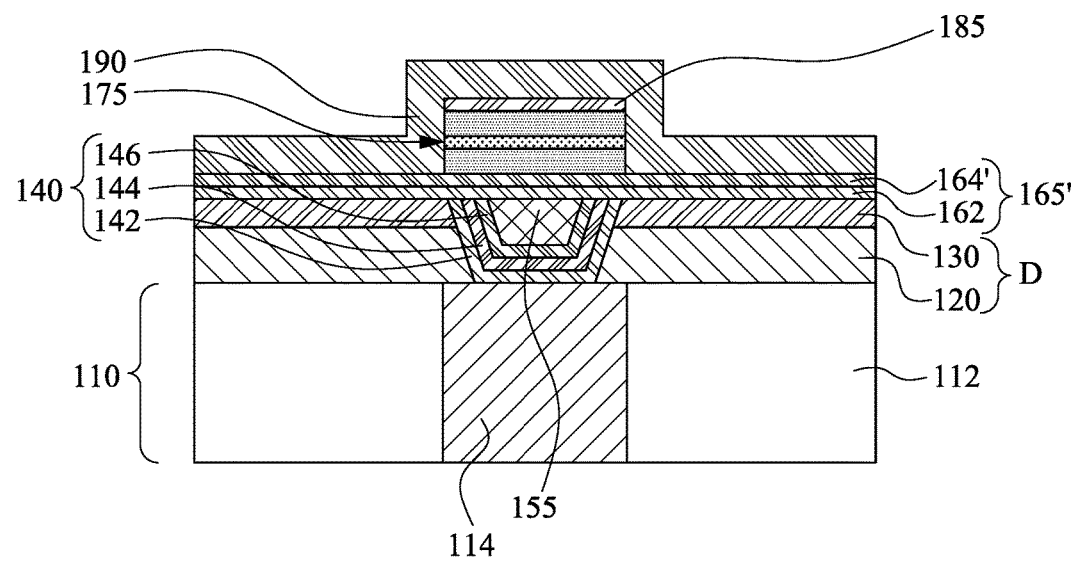

FIG. 11 illustrates formation of a spacer layer 190. A spacer layer 190 is formed over the exposed portions of the bottom electrode layer 165', over sidewalls of the resistance switching element 175 and the top electrode 185, and over top surface of the top electrode 185. The spacer layer 190 in some embodiments may include SiN, but in other embodiments may include SiC, SiON, silicon oxycarbide (SiOC), the like, and/or a combination thereof. The spacer layer 190 may be formed using CVD, PVD, ALD, the like, and/or a combination thereof.

Figure 12:
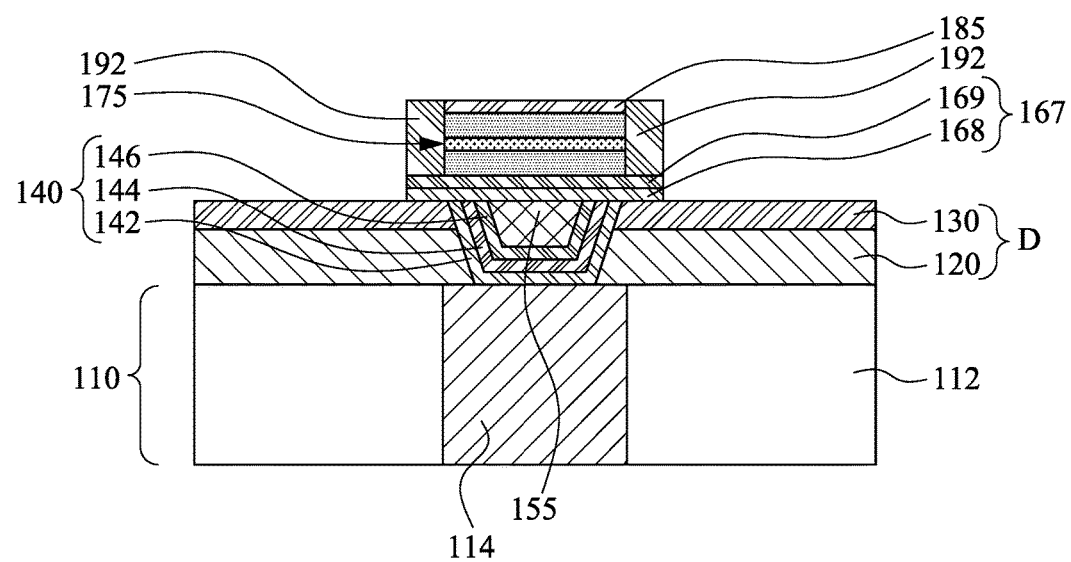

FIG. 12 illustrates formation of spacer 192 and bottom electrode 167. The spacer layer 190 (see FIG. 11) is etched to form spacer 192. The etching may be by an anisotropic etch using acceptable photolithography techniques. The spacer 192 directly adjoins sidewalls of the resistance switching element 175 and the top electrode 185. In some embodiments, the spacer 192 is formed around and encloses the resistance switching element 175 and top electrode 185. In other embodiments, separate spacers may be formed at various parts along the resistance switching element 175 and may not fully enclose the resistance switching element 175.

Thereafter, the bottom electrode layer 165 is patterned to form a bottom electrode 167 between the resistance switching element 175 and the BEVA. The bottom electrode 167 has a first bottom electrode 168 and a second bottom electrode 169 over the first bottom electrode 168. The first bottom electrode 168 is formed by patterning the first conductive layer 162, and the second bottom electrode 169 is formed by patterning the thinned conductive layer 164. The bottom electrode layer 165 can be patterned according to additional mask layer overlying the top electrode 185 (not shown). In some embodiments, the patterning process may include one or more etching operations, such as dry etching, wet etching or combinations thereof. In some embodiments, the patterning process may include a dry etching using etchant having gases including CF$_4$, CH$_2$F$_2$, Cl$_2$, BCl$_3$ and/or other chemicals, as example.

Figure 13:
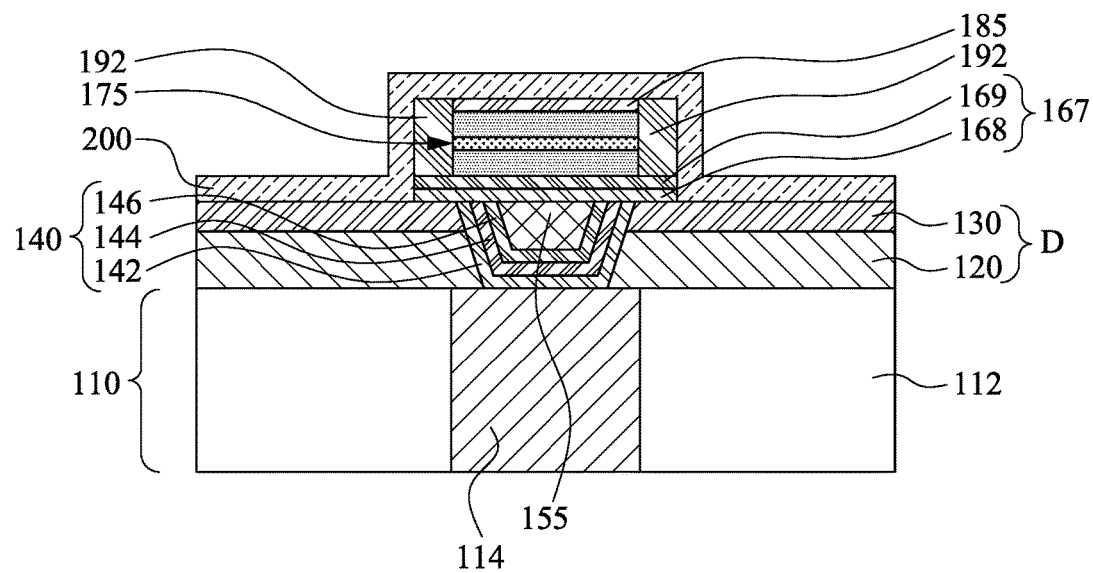

FIG. 13 illustrates formation of etch stop layer 200 conformally over the substrate 110. That is, top surfaces of the top electrode 185, spacer 192 and portions of the dielectric structure D uncovered by the bottom electrode 167 are covered by the etch stop layer 200, and sidewalls of the spacer 192 and the bottom electrode 167 are covered by the etch stop layer 200 as well. In some embodiments, the etch stop layer 200 may include silicon-nitride (SiN), silicon-carbide (SiC), tetraethyl orthosilicate (TEOS), silicon-rich oxide (SRO), or combinations thereof. The etch stop layer 200 may be a single-layered film or a multi-layered film. Formation of the etch stop layer 200 may be exemplarily performed using CVD, PVD, ALD, the like, and/or a combination thereof.

Figure 14:
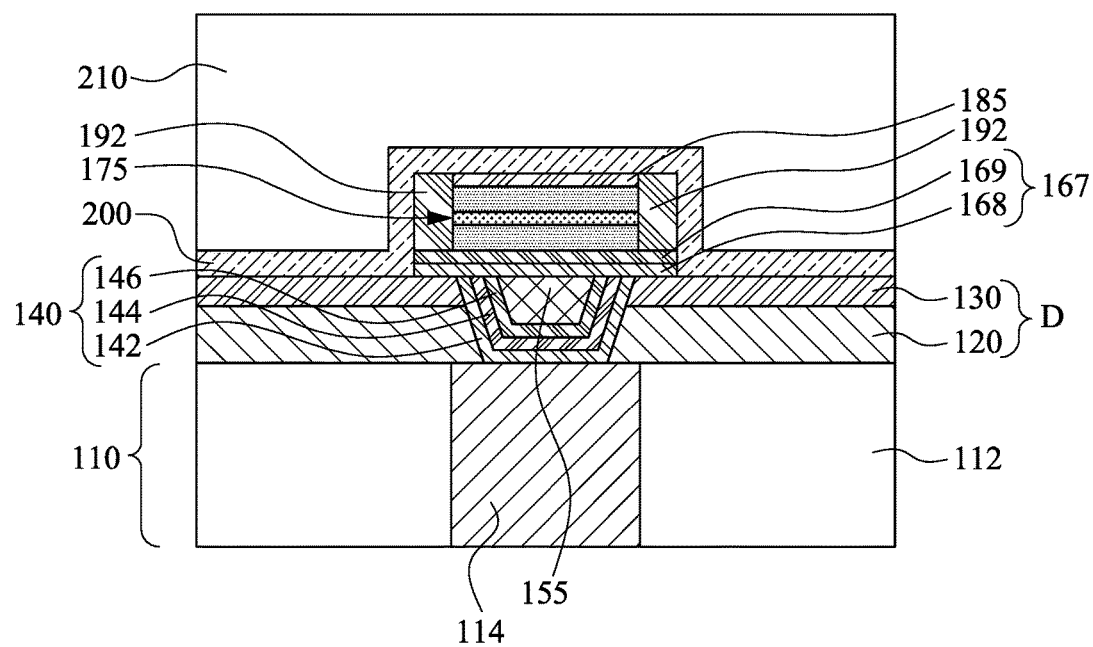

FIG. 14 illustrates formation of an interlayer dielectric (ILD) layer 210 over the substrate 110. In some embodiments, the ILD layer 210 may include an oxide layer, a low-k dielectric layer, or an ultra-low-k dielectric layer formed by a deposition process (e.g., CVD, PECVD, PVD, etc.).

Figure 15:
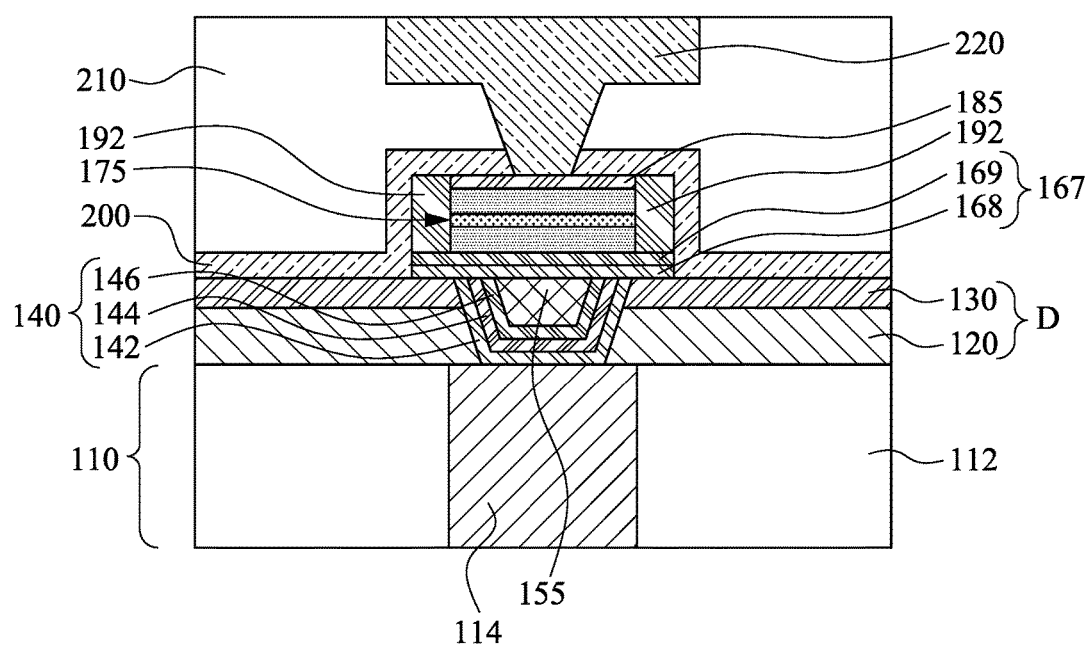

FIG. 15 illustrates formation of an upper metallization pattern 220 in the ILD layer 210. Formation of the upper metallization pattern 220 may be formed by etching an opening in the ILD layer 210 and the etch stop layer 200, and then filling one or more metals in the opening to form the upper metallization pattern 220, so that the upper metallization pattern 220 can reach on the top electrode 185. In some embodiments, the opening and the metallization pattern may be formed by dual damascene process. Trenches and via openings are formed through the ILD layer 210, and then filled with a conductive material (e.g., copper). A planarization is then performed.

Figure 16:
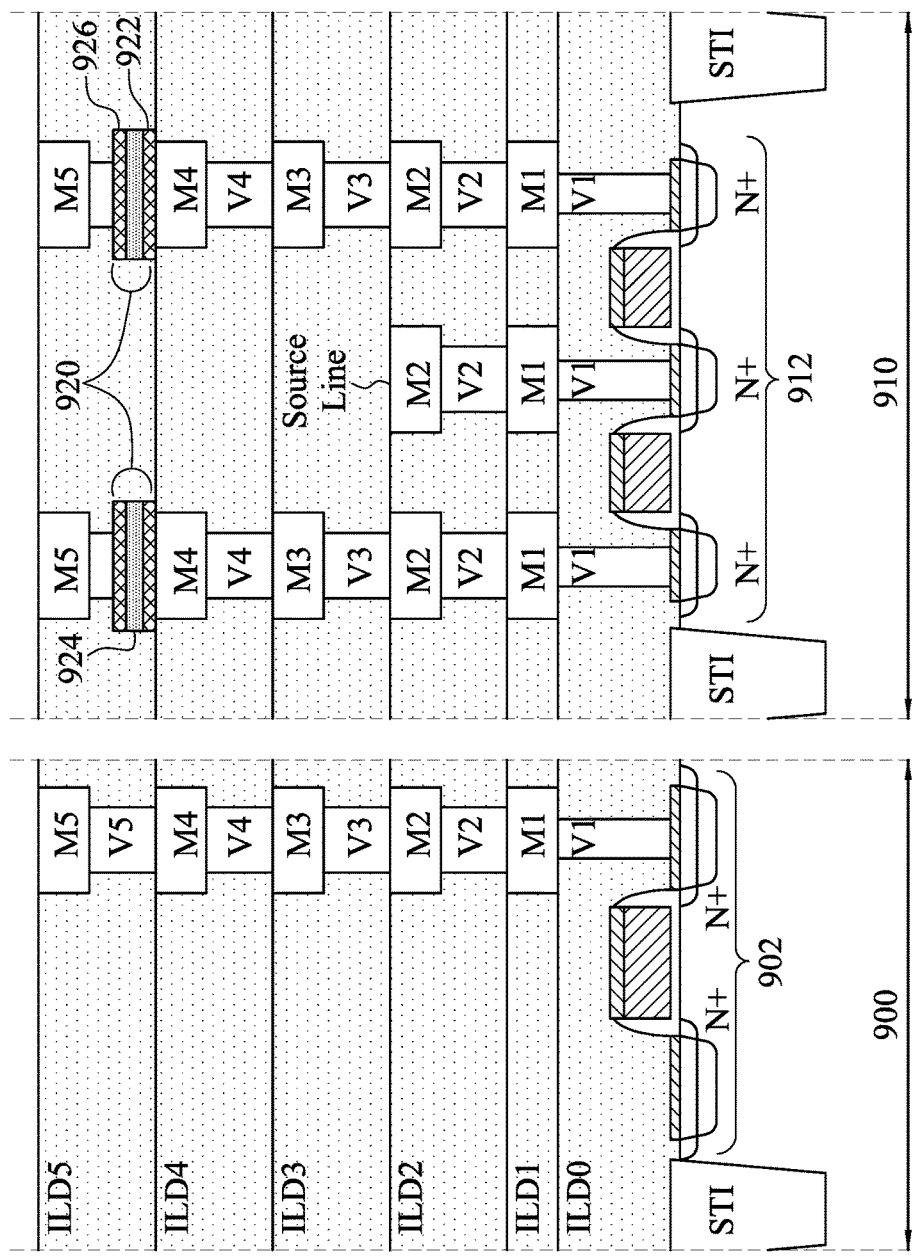
FIG. 16 illustrates an integrated circuit including memory devices and logic devices.

FIG. 16 illustrates an integrated circuit including memory devices and logic devices. The integrated circuit includes a logic region 900 and a memory region 910. Logic region 900 may include circuitry, such as the exemplary transistor 902, for processing information received from memory devices 920 in the memory region 910 and for controlling reading and writing functions of memory devices 920. In some embodiments, memory device 920 may include a bottom electrode structure 922 and top electrode structure 926, with a resistance switching element 924 sandwiched in between the bottom and top electrode structures 922 and 926. The bottom electrode structure 922 may include a void-free and/or dimple-free BEVA (such as the tungsten plug 155 and the lining metal layer 140 shown in FIG. 15) and a bottom electrode (such as the bottom electrode 167 shown in FIG. 15), the resistance switching element 924 and the top electrode structure 926 may be similar to the resistance switching element 175 and the top electrode 185 shown in FIG. 15, respectively.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of logic transistor 902. The memory region 910 includes a full metallization stack connecting memory devices 920 to transistors 912 in the memory region 910, and a partial metallization stack connecting a source line to transistors 912 in the memory region 910. Memory devices 920 are depicted as being fabricated in between the top of the M4 layer and the bottom the M5 layer. Also included in integrated circuit is a plurality of ILD layers. Six ILD layers, identified as ILD0 through ILD5 are depicted in FIG. 16 as spanning the logic region 900 and the memory region 910. The ILD layers may provide electrical insulation as well as structural support for the various features of the integrated circuit during many fabrication process steps.

In some embodiments, topography of the integrated circuit may cause one or more metal lines in the M4 layer in the logic region 900 to be raised with respect to the M4 layer in the memory region 910. Polish selectivity between tungsten BEVA of the bottom electrode structure 922 and its surrounding dielectric, however, is great enough such that the surrounding dielectric around the tungsten BEVA tends to resist or stop CMP well. Therefore, damage to the raised metal lines in the M4 layer in the logic region 900 can be mitigated.

According to some embodiments, a memory device includes a dielectric structure, a tungsten plug, a bottom electrode, a resistance switching element and a top electrode. The dielectric structure has an opening. The tungsten plug is embedded in the opening of the dielectric structure. The bottom electrode extends along top surfaces of the dielectric structure and the tungsten plug. The resistance switching element is present over the bottom electrode. The top electrode is present over the resistance switching element.

According to some embodiments, a memory device includes a dielectric structure, a bottom electrode via, a bottom electrode, a resistance switching element and a top electrode. The dielectric structure has an opening. The bottom electrode via is embedded in the opening of the dielectric structure. The bottom electrode via comprises a lining metal layer and a tungsten filler in a recess defined by the lining metal layer. The bottom electrode is present over the bottom electrode via. The resistance switching element is present over the bottom electrode. The top electrode is present over the resistance switching element.

According to some embodiments, a method of forming a memory device includes forming a polish stop structure over a substrate having a metallization pattern thereon, forming an opening in the polish stop structure to expose the metallization pattern, overfilling the opening with a tungsten layer, polishing a top surface of the tungsten layer until reaching the polish stop structure, wherein the polish stop structure has a higher resistance to the polishing the top surface of the tungsten layer than that of the tungsten layer, forming a bottom electrode layer over the polished tungsten layer, and forming a resistance switching element over the bottom electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, comprising:
   forming a polish stop structure over a substrate having a metallization pattern thereon;
   forming an opening in the polish stop structure to expose the metallization pattern;
   overfilling the opening with a tungsten layer;
   polishing a top surface of the tungsten layer until reaching the polish stop structure, wherein the polish stop structure has higher resistance to the polishing the top surface of the tungsten layer than that of the tungsten layer;
   forming a bottom electrode layer over the polished tungsten layer, wherein forming the bottom electrode layer comprises:
   forming a first conductive layer over the polished tungsten layer;
   forming a second conductive layer over the first conductive layer; and
   polishing the second conductive layer, wherein the first conductive layer has higher resistance to the polishing the second conductive layer than that of the second conductive layer; and
   forming a resistance switching element over the bottom electrode layer.

2. The method of claim 1, further comprising:
   polishing the bottom electrode layer to leave a polished bottom electrode layer over the polished tungsten layer.

3. The method of claim 1, further comprising:
   forming a metal liner in the opening and over a top surface of the polish stop structure before the overfilling the opening with the tungsten layer, wherein the metal liner has higher resistance to the polishing the top surface of the tungsten layer than that of the tungsten layer.

4. The method of claim 1, further comprising forming a diffusion barrier and a glue layer in the opening prior to overfilling the opening with the tungsten layer.

5. The method of claim 1, wherein forming the polish stop structure comprises:
   forming a first dielectric layer over the substrate; and
   forming a second dielectric layer over the first dielectric layer.

6. A method of forming a memory device, comprising:
   forming a stack of first and second dielectric layers over a metal structure;
   forming a bottom electrode via (BEVA) structure penetrating through and over the stack of first and second dielectric layers, wherein forming the BEVA comprises forming a stack of a diffusion barrier layer, a glue layer and a tungsten layer, wherein the glue layer has higher adhesion to the tungsten layer than that of the diffusion barrier layer;
   performing a first chemical mechanical polish (CMP) operation to the BEVA structure, wherein the first dielectric layer has higher polishing resistance to a slurry used in the first CMP operation than that of the second dielectric layer; and
   forming a stack of a bottom electrode layer, a resistance switching layer and a top electrode layer over the BEVA structure.

7. The method of claim 6, wherein the second dielectric layer has higher polishing resistance to the slurry used in the first CMP operation than that of the BEVA structure.

8. The method of claim 6, wherein the forming the BEVA comprises forming a stack of a diffusion barrier layer and a tungsten layer, and the diffusion barrier layer has higher polishing resistance to the slurry used in the first CMP operation than that of the tungsten layer.

9. The method of claim 8, wherein the second dielectric layer has higher polishing resistance to the slurry used in the first CMP operation than that of the diffusion barrier layer.

10. The method of claim 6, wherein the forming the glue layer comprises forming in sequence a titanium layer and a titanium nitride layer.

11. The method of claim 6, wherein the diffusion barrier layer is a tantalum nitride layer.

12. The method of claim 6, wherein the forming the bottom electrode layer comprises:
   forming a first metal layer over the BEVA structure and a second metal layer over the first metal layer; and
   performing a second CMP operation to the second metal layer, wherein the first metal layer has higher polishing resistance to a slurry used in the second CMP operation than that of the second metal layer.

13. The method of claim 12, wherein the slurry used in the first CMP operation and the slurry used in the second CMP operation are the same.

14. A method of forming a memory device, comprising:
   forming a bottom electrode via (BEVA) structure in a dielectric structure and over a metal structure;
   forming a stack of first and second conductive layers over the BEVA structure;
   performing a first chemical mechanical polish (CMP) operation to the second conductive layer, wherein the first conductive layer has higher polishing resistance to a slurry used in the first CMP operation than that of the second conductive layer; and
   forming a resistance switching layer and a top electrode layer over the second conductive layer.

15. The method of claim 14, wherein the second conductive layer has higher oxidation resistance than that of the first conductive layer.

16. The method of claim 14, wherein the second conductive layer is formed with a thickness greater than a thickness of the first conductive layer.

17. The method of claim 14, wherein the forming the BEVA structure comprises:
   forming in sequence a tantalum-containing layer, a titanium-containing layer and a tungsten layer.

18. The method of claim 17, wherein the first conductive layer is formed in contact with the tantalum-containing layer, the titanium-containing layer and the tungsten layer of the BEVA structure.

19. The method of claim 14, further comprising:
   performing a second CMP operation to the BEVA structure prior to the forming the stack of first and second conductive layers, wherein a slurry used in the second CMP operation is the same as the slurry used in the first CMP operation.

20. The method of claim 19, wherein the BEVA structure is formed with a void-free tungsten plug embedded in the dielectric structure.

* * * * *